United States Patent
Azdasht et al.

[19]

[11] Patent Number: 6,059,176
[45] Date of Patent: May 9, 2000

[54] DEVICE AND A METHOD FOR APPLYING A PLURALITY OF SOLDER GLOBULES TO A SUBSTRATE

[75] Inventors: Ghassem Azdasht; Ramin Azadeh; Clemens Rüthnick; Martin Lange, all of Berlin, Germany

[73] Assignee: Pac Tech Packaging Technologies G.m.b.H., Nauen, Germany

[21] Appl. No.: 09/056,479

[22] Filed: Apr. 7, 1998

[30] Foreign Application Priority Data

Apr. 11, 1997 [DE] Germany ............ 197 15 219
Sep. 9, 1997 [DE] Germany ............ 197 39 481

[51] Int. Cl.[7] ............ B23K 35/12; B23K 31/02; B23K 1/20; B23K 26/00
[52] U.S. Cl. ............ 228/254; 228/180.22; 228/219; 228/223; 228/234.1; 219/121.63; 219/121.65
[58] Field of Search ............ 228/248.1, 254, 228/234.1, 207, 223, 103, 180.22, 219; 427/96; 219/121.63, 121.65

[56] References Cited

U.S. PATENT DOCUMENTS

| | | | |
|---|---|---|---|
| 5,445,313 | 8/1995 | Boyd et al. ............ | 228/248.1 |
| 5,565,119 | 10/1996 | Behun et al. ............ | 219/121.63 |
| 5,653,381 | 8/1997 | Azdasht ............ | 228/254 |
| 5,695,667 | 12/1997 | Eguchi et al. ............ | 219/388 |
| 5,768,775 | 6/1998 | Nakazato ............ | 29/843 |
| 5,834,062 | 11/1998 | Johnson et al. ............ | 427/256 |
| 5,899,737 | 5/1999 | Trabucco ............ | 438/615 |
| 5,909,839 | 6/1999 | Belke, Jr. et al. ............ | 228/248.1 |
| 5,977,512 | 11/1999 | Azdasht et al. ............ | 219/121.63 |

*Primary Examiner*—Patrick Ryan
*Assistant Examiner*—Kiley Stoner
*Attorney, Agent, or Firm*—Dougherty & Associates

[57] ABSTRACT

A method for applying a plurality of solder globules to a substrate has a solder-globule fixing method, a plurality of glass fibers and a fibre holder. The solder-globule fixing method has provided therein a plurality of passages whose cross-sectional areas are smaller than the cross-sectional areas ofthe solder globules to be applied. The fibre holder is arranged relative to the solder-globule fixing device in such a way that between the fibre holder and the solder-globule fixing device a cavity is formed, which is adapted to be acted upon when submitted to pressure via a pressure-transmitting conduit. The fibre holder holds the glass fibres in alignment with the passages.

10 Claims, 2 Drawing Sheets

DEVICE AND A METHOD FOR APPLYING A PLURALITY OF SOLDER GLOBULES TO A SUBSTRATE

BACKGROUND OF THE INVENTION

1. Field of the Invention

The present invention refers to a device and a method for applying a plurality of solder globules to a substrate and especially to a device and a method for applying and positioning a plurality of solder globules on the substrate and for melting them onto the substrate by means of a laser.

2. Description of the Related Art

According to the prior art, a soldering point is formed on a substrate by applying a solder globule to the substrate and by melting it subsequently. This is carried out e.g. by means of a so-called "solder ball bumper". If a plurality of soldering points are to be positioned on a substrate, individual solder globules are applied to the substrate and melted e.g. by means of the above-mentioned method.

Furthermore, it is known to apply a plurality of solder globules to a substrate simultaneously and remelt then in a continuous furnace. When this method is used, a flux is, however, required for remelting the solder globules.

SUMMARY OF THE INVENTION

It is the object of the present invention to provide a device and a method for applying a plurality of solder globules to a substrate, which permit a timesaving application of the solder globules without the use of a flux.

The present invention provides a device for applying a plurality of solder globules to a substrate, the device having a solder-globule fixing device having provided therein a plurality of passages whose cross-sectional areas are smaller than the cross-sectional areas of the solder globules to be applied, a plurality of glass fibres, and a fibre holder arranged relative to the solder-globule fixing device in such a way that between the fibre holder and the solder-globule fixing device a cavity is formed, which is adapted to be acted upon by a pressure-transmitting device, the fibre holder holding the glass fibres in alignment with the passages.

The present invention provides a method for applying a plurality of solder globules to a substrate, the method having the steps of sucking on a plurality of solder globules through a plurality of passages provided in a solder-globule fixing device and having cross-sectional areas which are smaller than those of the solder globules, in such a way that respective solder globules are fixed to the passages, moving the solder-globule fixing device to the substrate and placing the solder globules onto a surface of the substrate, and melting the solder globules by conducting laser pulses through the passages.

The cavity is adapted to have applied thereto an underpressure, preferably by means of a pressure-transmitting device generating device, a device for generating and conducting laser pulses through the glass fibres being additionally provided in accordance with a preferred embodiment.

It follows that the present invention provides a device and a method permitting a flux-free remelting of solder globules on a substrate. The present invention also permits the whole remelting process to be realized within a very short time.

BRIEF DESCRIPTION OF THE DRAWINGS

In the following, preferred embodiments of the present invention will be explained in detail making reference to the drawings enclosed, in which.

DESCRIPTION OF THE PREFERRED EMBODIMENTS

Figure 1:
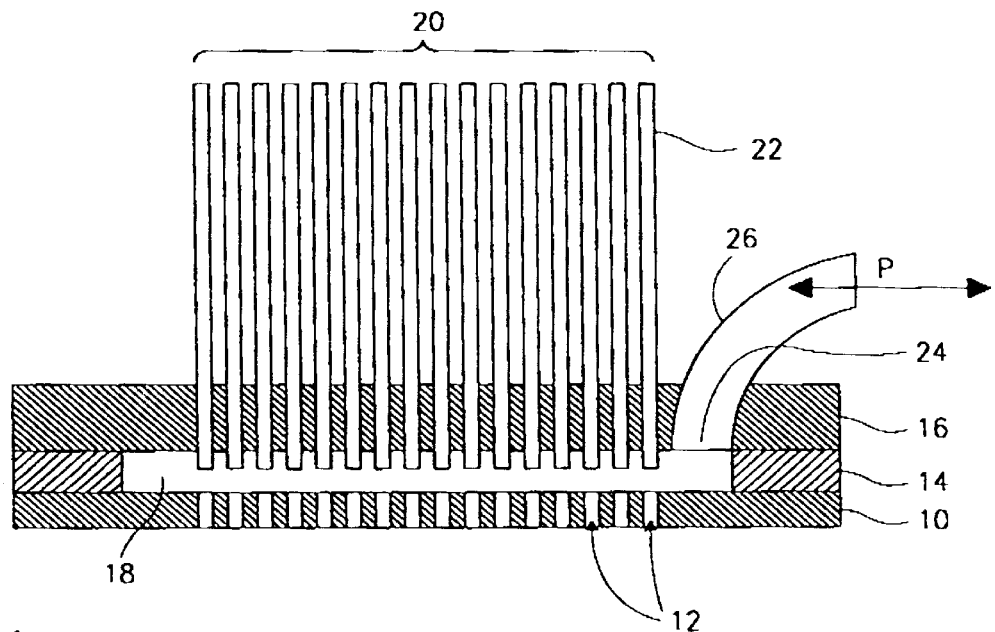
FIG. 1 to FIG. 4 show schematic cross-sectional representations of the device according to the present invention during different phases of the method according to the present invention.

FIG. 1 shows a schematic cross-sectional representation of a preferred embodiment of the device according to the present invention in an initial state.

In a support plate 10 passages 12 are provided, which extend through the support plate between two main surfaces thereof. In the embodiment shown, the support plate 10 has provided thereon spacers 14 in such a way that the spacers interconnect a fibre holder 16 and the support plate 10, a cavity 18 being defined between main surfaces of the fibre holder 16 and the support plate 10. The fibre holder 16 holds a glass fibre bundle 20 consisting of individual glass fibres 22, in such a way that the individual glass fibres 22 are directed at respective passages 12. For this purpose, the fibre holder 16 includes e.g. through-holes through which glass fibres 22 extend from one main surface to the other main surface of the fibre holder 16. In the embodiment shown in the figures, the glass fibres project into the cavity; this is, however, not an indispensable feature of the present invention.

In addition, the cavity 18 is provided with outlet 24 through which the cavity 18 can have applied thereto a pressure-transmitting device. This underpressure can be produced by means of a pressure-transmitting device, e.g. a vacuum pump. For this purpose, the vacuum pump is connected e outlet 24 of the cavity 18 e.g. via a pressure-transmitting device conduct 26, which can be a conventional piping.

A laser pulse generation means is adapted to be connected to the ends of the glass fibres spaced apart from the cavity, the laser pulse generation means being capable of conducting laser pulses through the individual glass fibres 22 of the glass fibre bundle 20.

Figure 3:
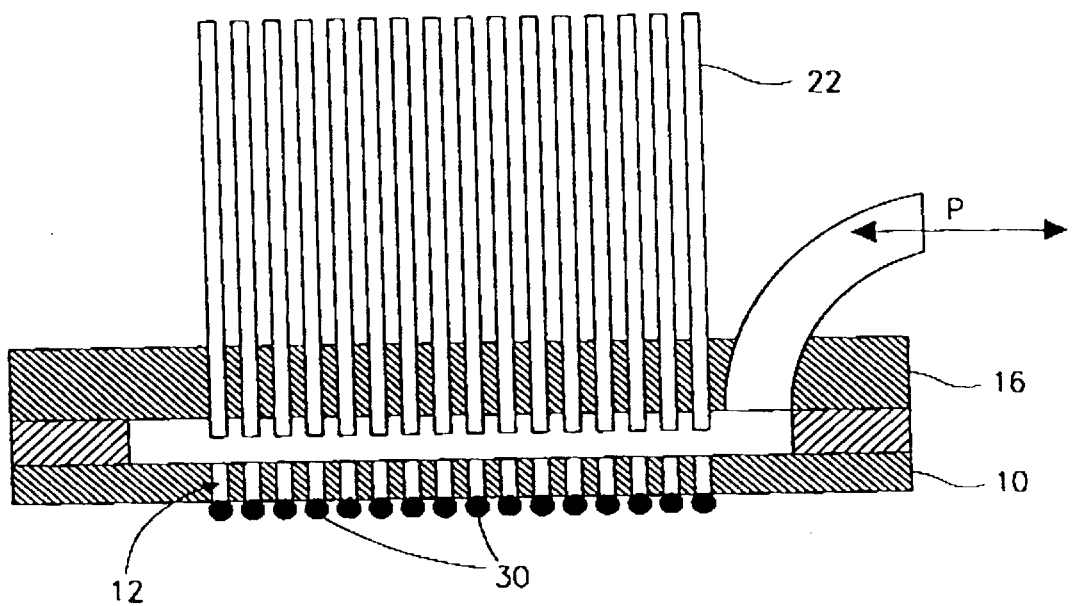
Figure 4:
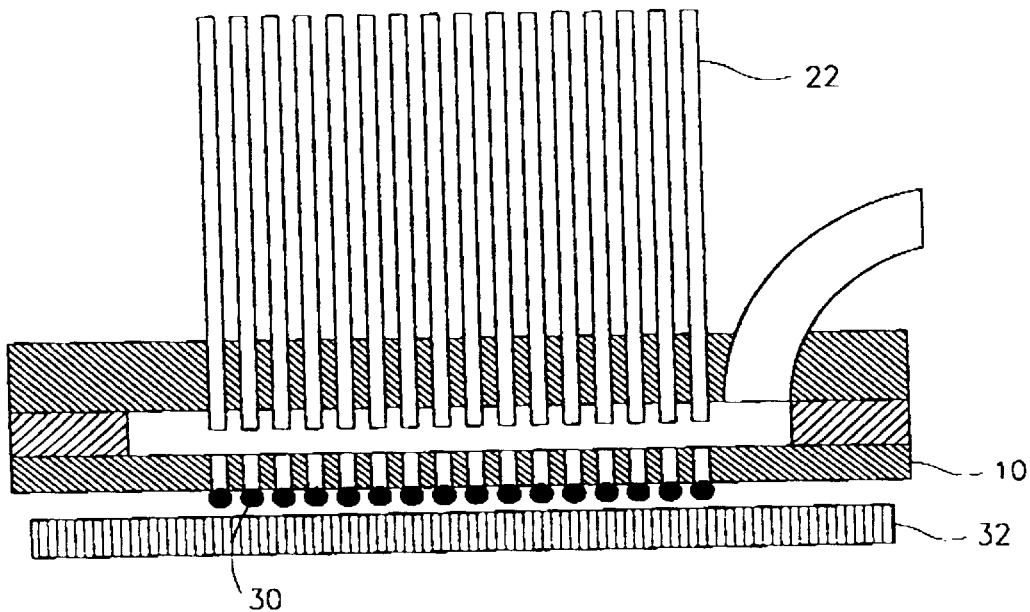

Making reference to FIG. 2 to 4, the mode of operation of the device according to the present invention as well as a preferred embodiment of the method according to the present invention will be explained in detail hereinbelow.

Figure 2:
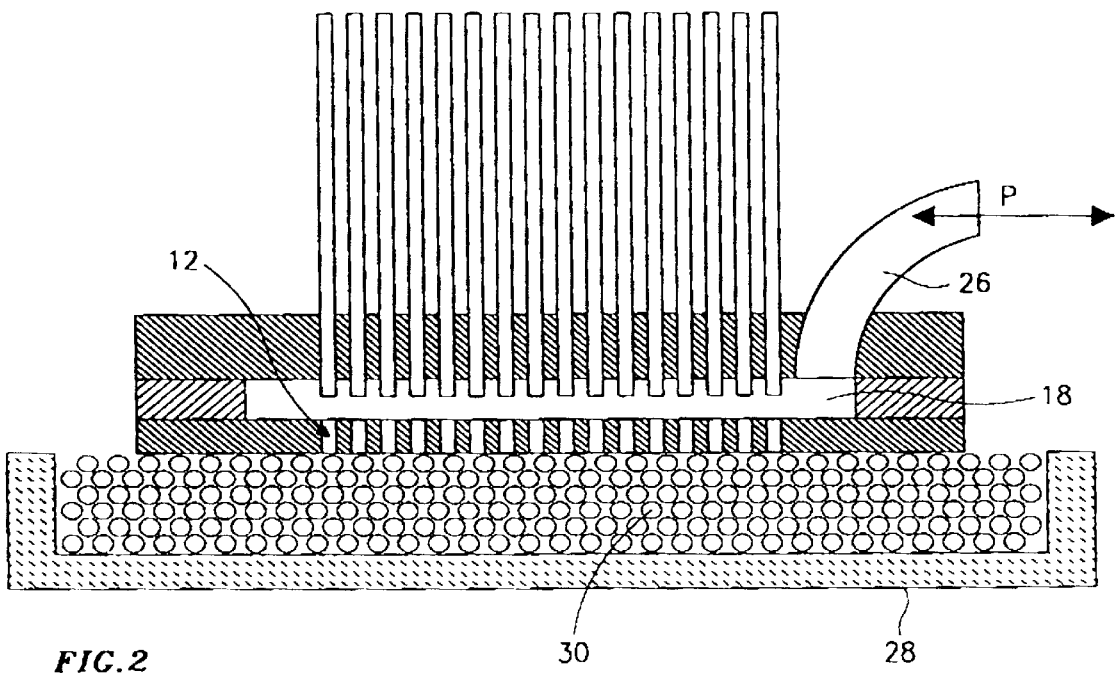

As can be seen in FIG. 2, the above-described device is first of all immersed into a solder-globule reservoir 28 in which a plurality of solder globules 30 is arranged, or it is placed on top of the plurality of solder globules 30. Following this, a pressure-transmitting device is applied to the conduit 26 so as to generate a vacuum e.g. in the cavity 18. Due to the vacuum, solder globules 30 are sucked onto the respective passages 12. The device according to the present invention with the sucked-on solder globules 30 is shown in FIG. 3. In view of the fact that the cross-sectional areas, i.e. the diameters, of the passages are smaller than the cross-sectional areas, i.e. diameters, of the solder globules, the solder globules 30 are secured in position on the passages 12 in the manner shown. These passages 12 can be provided in the support plate 10 in accordance with the desired pattern which the soldering points are subsequently intended to form on the substrate. When the solder globules 30 have been sucked on, it can be checked e.g. by means of pressurized air and/or a laser beam whether all globules are fixed to the support plate 10.

Subsequently, the solder globules 30 fixed to the support plate 10 are moved to a substrate 32 and placed onto a surface of the substrate, cf. FIG. 4. Following this, the solder globules 30 placed onto of the surface are remelted by means of laser energy.

For this purpose, a glass fibre 22 is provided for each solder globule 30, the glass fibre 22 being directed at the solder globule 30 in question through a respective passage 12. A laser pulse is conducted through the glass fibre in question, the laser pulse impinging on the respective solder globule 30 through the respective passage 12 so as to remelt the solder globule. For this purpose, the fibre bundles are introduced into a laser head (not shown) in the preferred embodiment, the laser beam being conducted into the glass fibre e.g. by means of a scanner system.

When the solder globules 30 are being remelted, i.e. when they are acted upon by the laser pulse, the fixed solder globules preferably have applied thereto an inert gas so as to protect the surface of the solder globules against oxidation during the soldering process. This inert gas can be supplied through the same passages 12.

In accordance with an alternative embodiment, once the solder globules have been placed on a substrate, a force is applied to the solder globules while they are being melted. The application of such a force permits e.g. thermocompression bonding of gold.

To those skilled in the art, it will be obvious that the glass fibre bundle 22 may consist of a plurality of glass fibres which are uniformly distributed over the fibre holder 16; depending on the pattern that has been chosen for the passages 12, the glass fibres which are directed at one of the passages have then applied thereto a laser pulse when the solder globules are melted on. Alternatively, the glass fibres can be positioned in the fibre holder in a number and in mode of arrangement corresponding to the number and the mode of arrangement of the passages in the support plate 10.

What is claimed is:

1. A method for melting a plurality of solder globules to a substrate, comprising the steps of:

sucking on a plurality of solder globules through a plurality of passages provided in a solder-globule fixing device and having cross-sectional areas which are smaller than those of the solder globules, in such a way that respective solder globules are fixed to said passages;

moving said solder-globule fixing device to said substrate and placing the solder globules onto a surface of said substrate; and conducting laser pulses through optical fibers held stationary relative to said passages in alignment therewith, such that said laser pulses impinge on the solder globules via said passages to melt said solder globules.

2. A method according to claim 1, wherein the solder globules are sucked from a solder-globule reservoir.

3. A method according to claim 1, wherein, during the solder-globule melting process, an inert gas is supplied through the passages to said solder globules.

4. A method according to claim 1, wherein, after the sucking step, it is checked whether a solder globule has been fixed to each passage.

5. A method according to claim 1, wherein a force is applied to the solder globules, when said solder globules have been placed onto the substrate.

6. A method for melting a plurality of solder globules to a substrate using a solder-globule fixing device having a plurality of passages provided therein, optical fibers held stationary relative to the passages and in alignment therewith, and a device for generating and conducting laser pulses through the optical fibers, said method comprising the steps of:

sucking on a plurality of solder globules through the plurality of passages provided in the solder-globule fixing device and having cross-sectional areas which are smaller than those of the solder globules, in such a way that respective solder globules are fixed to the passages;

moving the solder-globule fixing device to the substrate and placing the solder globules onto a surface of the substrate; and conducting laser pulses with the laser generating device through the optical fibers such that the laser pulses impinge on the solder globules via the passages to melt the solder globules.

7. A method according to claim 6 wherein the solder globules are sucked from a solder-globule reservoir.

8. A method according to claim 6 wherein during the solder-globule melting process, an inert gas is supplied through the passages to the solder globules.

9. A method according to claim 6 wherein after the sucking step it is checked whether a solder globule has been fixed to each passage.

10. A method according to claim 6 wherein a force is applied to the solder globules when the solder globules have been placed onto the substrate.

* * * * *